US006817602B2

(12) United States Patent
Charles et al.

(10) Patent No.: US 6,817,602 B2
(45) Date of Patent: Nov. 16, 2004

(54) MANUFACTURING SYSTEM METHOD FOR PROCESSING A LITHOGRAPHY MASK CONTAINER

(75) Inventors: Alain Charles, Singapore (SG); John Maltabes, Austin, TX (US); Karl Mautz, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 319 days.

(21) Appl. No.: 09/941,284

(22) Filed: Aug. 28, 2001

(65) Prior Publication Data

US 2002/0044266 A1 Apr. 18, 2002

(30) Foreign Application Priority Data

Aug. 29, 2000  (EP) ............................................. 00118695

(51) Int. Cl.[7] ............................. B23Q 1/64; G03C 5/00
(52) U.S. Cl. ........................................ 269/56; 430/322
(58) Field of Search ............................... 430/5; 269/56; 414/277; 206/711

(56) References Cited

U.S. PATENT DOCUMENTS

| 4,827,110 A | | 5/1989 | Rossi et al. ................. 235/376 |
|---|---|---|---|
| 4,888,473 A | | 12/1989 | Rossi et al. ................. 235/376 |
| 5,166,884 A | * | 11/1992 | Maney et al. ............... 700/113 |
| 5,397,665 A | | 3/1995 | Tabuchi et al. ................ 430/5 |
| 5,399,531 A | | 3/1995 | Wu ........................... 437/205 |
| 5,434,790 A | * | 7/1995 | Saka et al. .................. 700/110 |
| 5,455,894 A | | 10/1995 | Conboy et al. ................ 395/82 |
| 5,570,990 A | * | 11/1996 | Bonora et al. ............... 414/543 |
| 5,755,332 A | | 5/1998 | Holliday et al. ............. 206/711 |
| 5,849,440 A | | 12/1998 | Lucas et al. .................... 430/5 |
| 5,938,860 A | | 8/1999 | Williams ...................... 134/34 |
| 5,963,315 A | | 10/1999 | Hiatt et al. ............... 356/237.3 |
| 5,976,199 A | | 11/1999 | Wu et al. .................. 29/25.01 |
| 5,980,187 A | | 11/1999 | Verhovsky ................... 414/416 |
| 6,008,727 A | | 12/1999 | Want et al. ............... 340/572.1 |
| 6,055,040 A | | 4/2000 | Sego ........................... 355/76 |
| 6,098,809 A | | 8/2000 | Okada et al. ................ 206/711 |

FOREIGN PATENT DOCUMENTS

| EP | 0846983 | 6/1998 | ............. G03F/7/20 |
|---|---|---|---|
| EP | 0932195 | 7/1999 | ........... H01L/21/66 |
| WO | WO 97/38364 | 10/1997 | ............ G06F/1/00 |
| WO | WO 99 /31713 | 6/1999 | ........... H01L/21/00 |
| WO | WO 99/47864 | 9/1999 | ............. F24F/3/00 |
| WO | WO 00/02236 | 1/2000 | ........... H01L/21/00 |
| WO | WO 00/56633 | 9/2000 | ........... B65D/85/48 |

* cited by examiner

*Primary Examiner*—S. Rosasco
(74) *Attorney, Agent, or Firm*—Robert L. King

(57) ABSTRACT

An electronic device (205) is attached to a container (200) that carries a lithography mask (201) through a semiconductor factory (100) form a first station (110) to a second station (120). In the device, a receiver unit (210) receives first data (111) indicating how the first station has used the mask in a first process; a memory unit (220) temporarily stores the first data; a processor unit (230) processes the first data and provides second data (122) indicating how the second station uses the mask in a second future process; and a transmitter unit (240) transmits the second data to the second station or to a factory host.

20 Claims, 2 Drawing Sheets

MANUFACTURING SYSTEM METHOD FOR PROCESSING A LITHOGRAPHY MASK CONTAINER

FIELD OF THE INVENTION

The present invention relates to integrated circuit fabrication and, more particularly, to a method and apparatus for handling lithography mask containers.

BACKGROUND OF THE INVENTION

Integrated circuits are manufactured from semiconductor wafers in semiconductor factories ("wafer fabs"). The wafers are processed in a variety of stations, among them lithography stations ("exposure tools"). In the lithography station, the wafer is patterned by exposing it to electromagnetic radiation (e.g., ultra-violet light) going through a mask. The masks are sometimes referred to as lithographic reticle; an example is illustrated in U.S. Pat. No. 5,849,440. The masks optionally have pellicles to keep away particles.

Between lithography stations as well as between stations and storage facilities, the masks are carried in mask containers (also known as "reticle holders"). Usually, the containers are made from plastic.

Due to their extraordinary precision and complexity, the masks are very expensive. It is therefore of paramount importance to handle the mask and the containers with extreme care. The diligence of a human operator is relied on, for example, when masks and containers are identified with handwritten labels. Unfortunately, people are relatively slow, quickly fatigued by repetitive tasks, and handling errors are potentially catastrophic.

Mask identification such as, for example, a tracking number, a type classification of the mask, lithography tool classification, is provided on the mask itself for visual inspection. However, inspecting a mask requires the operator to remove the mask from the container. For reading identification in machine-readable form (e.g., barcode, OCR), it may also be required to put the mask into a lithography tool. Besides the time needed by the operator or by the tool for identifying, mask inspection might (i) cause the generation of particles, (ii) damage the mask, or (iii) mix up the order of multiple masks in a single container.

There is an ongoing need to provide an improved mask container which mitigates some or all of these disadvantages and limitations of the prior art.

DETAILED DESCRIPTION OF THE INVENTION

The present invention provides an improvement to the lithography mask carrying container by providing an electronic device that is attached to the container. By storing and processing data, the device helps to increase efficiency in the semiconductor wafer factory.

Figure 1:
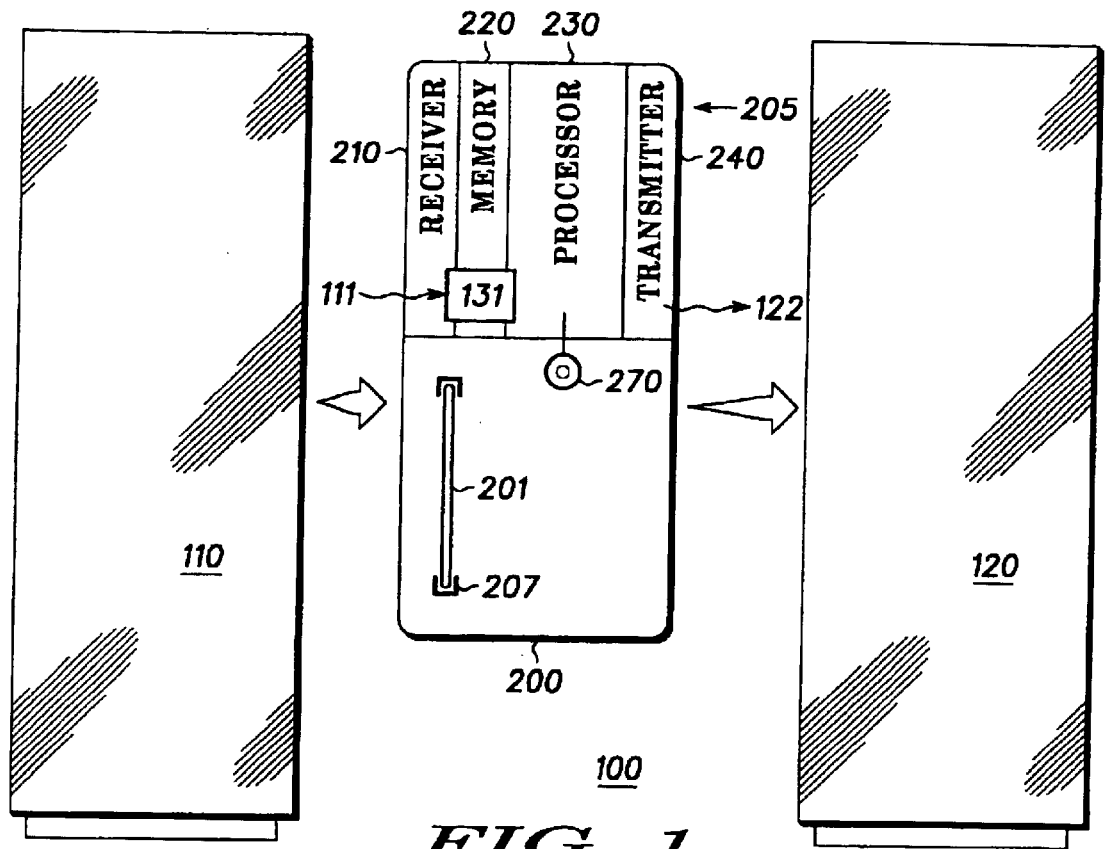
FIG. 1 is a simplified block diagram of a semiconductor wafer manufacturing system with a first station, a second station, a mask container and an electronic device according to the present invention, wherein the device is associated with the mask container.

FIG. 1 is a simplified block diagram of semiconductor wafer manufacturing system 100 ("factory", "wafer fab") with first station 110, second station 120, mask container 200, and electronic device 205 ("device") according to the present invention. Device 205 is associated with mask container 200 and comprises: receiver unit 210 to receive first data 111 (arrow), memory unit 220 to temporarily store first data 111, processor unit 230 to process first data 111 and to provide second data 122 (arrow), and transmitter unit 240 to transmit second data 122.

Mask container 200 (hereinafter "container") is any suitable enclosure that protects lithography mask 201 from contamination (e.g., by particles). Usually, container 200 has slots 207, each for holding a single mask 201. Container 200 carries at least one mask 201; however, up to N masks in a single container can be carried. For example, a mask container designed for 300 millimeter wafer factory can carry up to preferably N=6 masks. However, this value can be higher. For convenience, the following explanation uses the term "mask" in singular with the intention that "mask" stands for any number between 0 and N of masks. Container 200 can also be empty, for example, for container 200 that is being cleaned.

Mask container 200 carries lithography mask 201 between first station 110 and second station 120. Station 110 uses mask 201 (or container 200) in a first process (cf. step 310 in FIG. 4); at a later time-point, station 120 uses mask 201 in a second process (cf. 320 in FIG. 4).

Preferably, first data 111 is indicative on how station 120 has used mask 201 in the first process, and second data 122 is indicative on how station 120 uses mask 201 in the second process. Preferably, transmitter unit 240 transmits second data 122 to station 120 before station 120 uses mask 201 in the second process.

Preferably, processor unit 230 processes first data 111 by combining first data 111 with instruction 131. Preferably, instruction 131 is a set of commands of computer executable program code. Preferably, instruction 131 is also indicative on how mask 201 is used in the second process. Receiver unit 210 receives instruction 131, for example, from a host computer (cf. FIG. 3). It is convenient that receiver unit 210 receives first data 111 at a first time point and receives instruction 131 at a second time point that comes later. Protocols that ensure reception and transmission to receiver unit 210 and from transmitter unit 240 are well known in the art. Optionally, processor unit 230 receives first data 111 from sensor 270 located within mask container 200.

Figure 3:
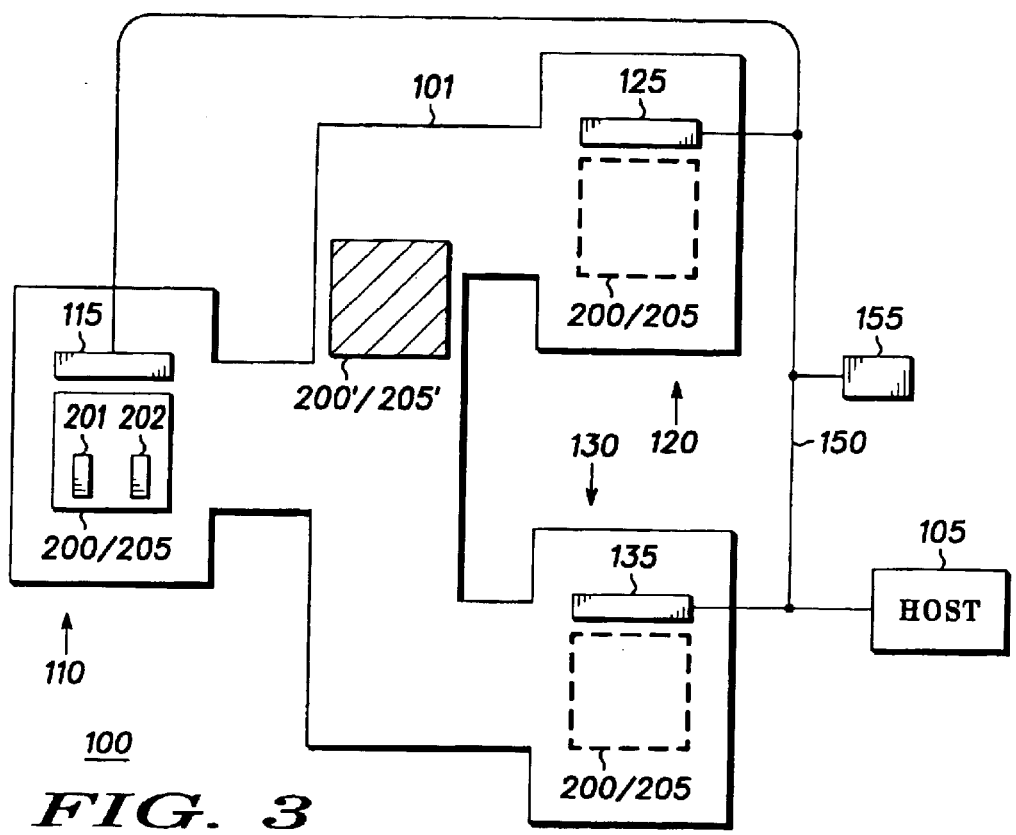
FIG. 3 is a simplified block diagram of the system of FIG. 1 with more equipment.

The term "using a mask in a process" (and its language variations) is intended to comprise at least one of the following actions:

inserting mask 201 into container 200;

removing mask 201 from container 200;

in combination, inserting and removing multiple masks 201/202 (cf. FIG. 3);

writing data to mask 201 (e.g., by adding a barcode label);

reading data from mask 201 (e.g., reading the barcode label);

exposing a semiconductor wafer (not illustrated) or any other work-product by sending electromagnetic radiation through mask 201;

storing mask 201;

transporting mask 201 from one location to another location within the wafer factory (cf. FIG. 3);

manufacturing mask 201;

maintaining mask 201 (e.g., cleaning);

modifying mask 201 by changing its exposure properties (e.g., through aging);

damaging mask 201, disposing of mask 201, recycling mask 201, or any other action that removes mask 201 from the factory;

testing and measuring the properties of mask 201, either directly (e.g., evaluating an exposure picture), or indirectly, (e.g., evaluating a wafer exposed to radiation by the mask);

assigning an identifier for mask 201;

assigning an identifier for a plurality of masks 201 (e.g., type classification); and transferring information that relates to mask 201 from a first electronic device in a first container to a further electronic device in a further container. This action catalogue will be referred to later in connection with a method.

For example, and without the intention to be limiting, station 110/120 can be the following: a mask sorter for inserting the mask into the container, removing the mask from the container, inserting and removing multiple masks to and from the container; a lithography exposure tool for exposing a semiconductor wafer (not illustrated) or any other work-product by sending electromagnetic radiation through the mask (the main purpose of the mask); a transport tool (e.g., automated vehicle, robot), for transporting the mask from one location in the factory to another location in the factory, or for storing the mask, for writing data to the mask or reading data from the mask; a manufacturing tool for manufacturing the mask (preferably, outside the factory), for assigning a single identifier for a single mask or a single identifier to a plurality of masks; a metrology tool for testing and measuring the properties of the mask; a cleaning tool for removing contamination from the mask; or any other equipment inside or outside the factory that serves one or more actions referred to in the catalogue.

Some actions are unwanted and can occur by chance in any station, such as damaging the mask by accident. Application examples are given later. Having used the term "mask" in connection with the above mentioned actions is convenient; however, persons of skill in the art are able, based on the disclosure herein, to practice the present invention also for actions with mask containers 200, independently whether the container carries a mask or not.

Figure 2:
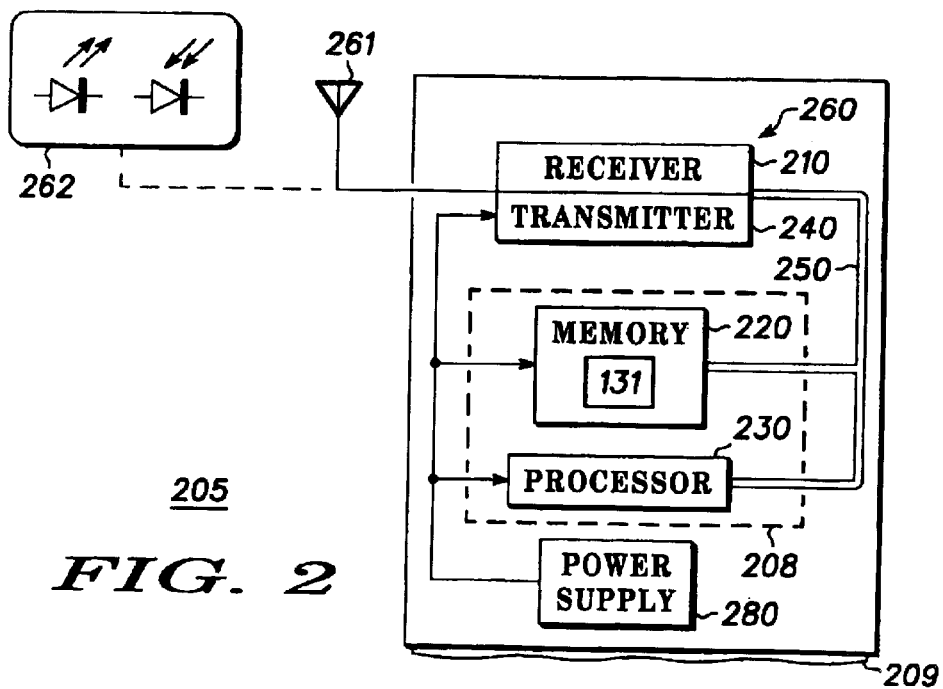
FIG. 2 is a simplified block diagram of the electronic device of FIG. 1 with more detail.

FIG. 2 is a simplified block diagram of electronic device 205 of FIG. 1 with more detail. Electronic device 205 is shown with receiver unit 210, memory unit 220, processor unit 230, transmitter unit 240, as well as with bus 250 coupling them. Preferably, processor unit 230 and memory unit 220 are implemented on a single monolithic chip ("embedded microprocessor", dashed frame 208).

Preferably, receiver unit 210 and transmitter unit 240 are combined to transceiver unit 260. Conveniently, transceiver unit 260 is a wireless transceiver operating as radio frequency transceiver (cf. antenna 261), or an infra-red transceiver (cf. optical interface 262 with symbols for a light emitting diode (LED) and for a photo diode). Persons of skill in the art are able to use other wireless transceivers without the need of further explanation herein. For example, a transceiver can comprise inductive coils. In case of a wirebound transceiver, a direct electrical contact to the environment of device 205 is established (not illustrated).

Preferably, memory unit 220 is a non-volatile memory, such as an EEPROM or an SRAM. Volatile memories can also be used (e.g., DRAM). Conveniently, instruction 131 stored in memory unit 220 optionally comprises also information about further processes (additionally to process 320).

Power supply 280 for units 210/240, 220, 230 is implemented by a long lasting small battery, by a photovoltaic element, by a thermal converter, by an inductive power converter that relies on externally applied electromagnetic energy or by any other suitable power supply means.

Preferably, device 205 remains attached to container 200 permanently; i.e., also when container 200 is cleaned. A convenient attaching means is adhesive 209. Preferably, device 205 is located at the same location for all containers 200 in factory 100. Attaching device 209 outside the container, for example, outside its plastic enclosure is convenient.

Further modifications are possible. For example, container 200 can have a barcode tag; an operator interface (e.g., display, buzzer, keys) can also be provided with device 205.

FIG. 3 is a simplified block diagram of factory 100 of FIG. 1 with more equipment: stations 110/120 (cf. FIG. 1), third station 130, container transportation means 101, factory transmitter 155, station transmitters 115, 125, 135 (at stations 110, 120, 130, respectively), 105 host and factory bus 150 ("backbone"). The combination of container 200 with device 205 is shown in station 110. Depending on the second data, combination 200/205 is moved to station 120 or, optionally, moved to station 130. FIG. 3 also shows further container 200' and further device 205'.

In the example of FIG. 3, container 205 carries mask 201 and mask 202 (cf. above maximum N masks). There are applications (e.g., rearranging masks) where second data 122 (cf. FIG. 1) also determines the quality and quantity of third process 330 in a third station 130 using mask 202.

Factory transmitter 155 is a long range transmitter that exchanges data (e.g., data 111, 122, instruction 131, cf. FIG. 1) with device 205 independently from its location. Preferably, transmitter 155 simultaneously communicates with further devices. As mentioned, protocols are well known: the operation in time frames ("time slots") is one option.

In comparison to the factory transmitters, station transmitters 115, 125, 135 have a range that is, preferably, reduced to local communication between device 201 and stations 110, 120, 130, respectively. Communication between device and station occurs when both are proximate, with an actual distance varying based on what kind of transceiver 260 is used.

In factory 100 with a plurality of container/device combinations 200/205, data is exchanged between devices as well as between stations and devices. In other words, transceiver 260 of electronic device 205 communicates with further electronic device 205' at further container 200' and with further stations. Where needed, communication can be routed at least partly via factory bus 250, for example, in coordination by host 105.

Figure 4:
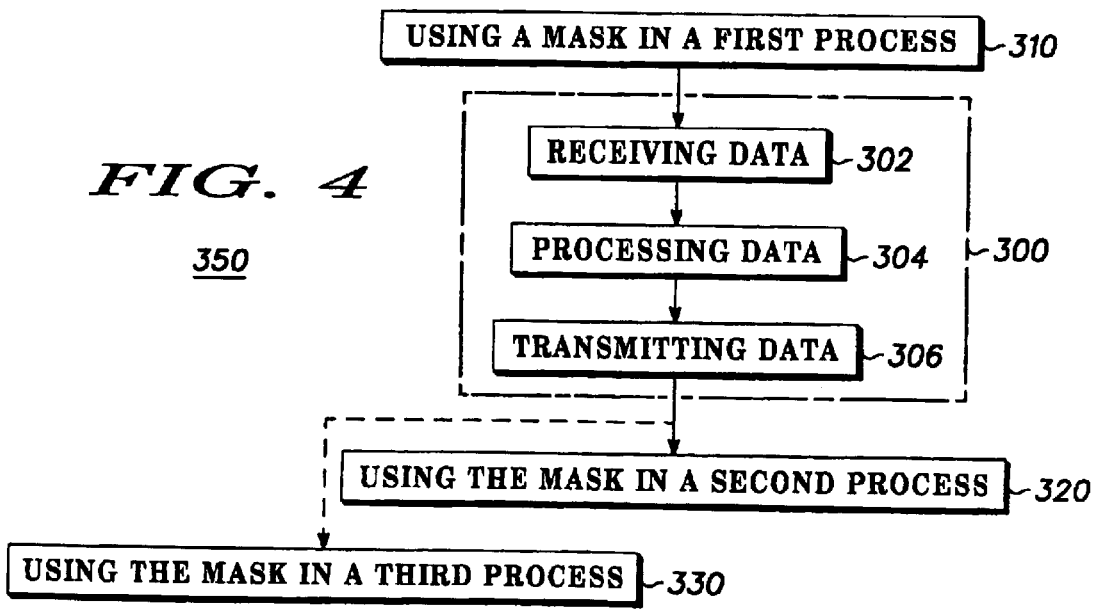
FIG. 4 is a simplified flow chart diagram of a system operation that comprises a method to operate the electronic device according to the present invention.

FIG. 4 is a simplified flow chart diagram of a system operation 350 that comprises method 300 to operate electronic device 205 according to the present invention. Operation method 350 comprises: using a lithography mask (cf. mask 201) in first process 310, using the mask in second process 320, and method 300 to operate device 205 (dashed frame). Using the mask in third process 330 is optional. Method 300 comprises the steps receiving (sending) 302, processing 304 and transmitting 306. Method 300 is performed after first station 110 has used the mask in first process 310 and, preferably, before second station 120 uses the mask in second process 320.

In receiving step 302, device 205 receives first data 111, preferably, from first station 120 or from host computer 105 (cf. FIG. 3). First data 111 indicates quality and quantity of first process 310.

Based on first data 111, in processing step 304, device 205 processes first data 111 in step 304, preferably, by combining first data 111 with instruction 131 (cf. FIG. 1). By indicating the expected quality and quantity of second process 320, instruction 131 indicates how the mask is used in second process 320. As mentioned above, processing 304 is performed to provide second data 122 that determines final quality and quantity of second process 320. In transmitting step 306, device 205 transmits second data 122, preferably, to second station 120 or to host computer 105.

Optionally, in processing step 304, device 205 provides third data for an alternative third process 330 (dashed line) and in transmitting step 306, device 205 transmits the third data to third station 130. Conveniently, the third data is provided to control third process 330 using further mask 202 (cf. FIG. 3).

Returning to explain method 350 to operate wafer manufacturing system 100 (that uses lithography mask container 200 having electronic device 205 attached thereto), method 350 is presented as follows:

Step 310, first station 110 applies first process 310 using mask 201; step 302, first station 110 sends first data 111 to electronic device 205 (data 111 indicates quality and quantity of process 310), electronic device 205 receives first data 111; step 304, electronic device 205, based on first data 111, qualifies instruction 131 (processing to indicate expected quality and quantity of process 320) to provide second data 122; step 306, electronic device 205 transmits second data 122 to second station 120 (or to the host); step 320, second station 120 applies second process 320 using mask 201.

In short, operating a manufacturing system for semiconductor wafers (employing a plurality of lithography masks, carried in plurality of mask containers) comprises the following steps: collectively for steps 302/304/306, (a) exchanging data 111 relating to predetermined process 310/320 between electronic device 205 (attached to container 200) and host computer system 105; and (b) using lithography 201 mask in station 110/120 in predetermined process 310/320, wherein using is an action described in the catalogue above.

The following column-like overviews explain representative applications for the present invention. For all cases, similar left columns indicate station 110 with process 310 using mask 201, first data 111, optional instruction 131, second data 122, and station 120 with process 320; and if applicable, third station 130 and third process 330 (cf. FIG. 4). The right columns give examples; reference numbers for device 200, mask 201, etc. are left out for simplicity. The applications are intended to be non-limiting examples; those of skill in the art will find further applications without departing from the scope of the present invention. The phrase "for example" is therefore incorporated by reference into each text line on the right side.

EXAMPLE 1
Sorting Masks

| | |
|---|---|
| station 110 | mask sorter |
| process 310 | setting up an arrangement of masks by selectively inserting or removing masks from the container |
| data 111 | table with mask and slot identification |
| data 122 | lithography station targeted for using each the masks |
| process 320 | lithography |

This approach allows the reduction of overhead in the host. Optionally, station 120 can authenticate incoming masks to avoid using the wrong one. Tracking each individual mask as it goes through the factory becomes possible.

EXAMPLE 2
Shifting Masks between Containers

| | |
|---|---|
| station 110 | mask sorter |
| process 310 | shifting masks from a first container to a second container |
| data 111 | identification for each mask stored in the electronic device of the first container |
| data 122 | identification for each mask to be stored in the electronic device of the second container, also assigning an identifier to the second container |
| process 320 | transferring data between the electronic devices, preferably, via the host computer or directly from device to device |

EXAMPLE 3
Recording Restrictions, Inspection Results

| | |
|---|---|
| station 110 | any station, mask manufacturing equipment, lithography tool |
| process 310 | manufacturing, exposing wafers by lithography |
| data 111 | restrictions for use, specific to wavelengths or caused by defects on the mask |
| data 122 | optionally, identical to data 111, also processed to fit to the lithography station that uses the mask next |
| process 320 | exposing wafers by lithography wherein the restrictions are considered |

EXAMPLE 4
Recording Mask Lifetime

| | |
|---|---|
| station 110 | any station that by using the mask changes the properties of the mask, especially, fast aging for lithography that uses wavelengths less than 200 nm |
| process 310 | exposing wafers by lithography |
| data 111 | the number of exposure steps for that the mask has been used |
| inst. 131 | the command to compare this number to a predetermined maximum number |
| data 122 | indication whether the mask is acceptable for use or not |
| process 320 | exposing wafers by using acceptable mask, or |
| process 330 | replacing unacceptable mask |

EXAMPLE 5

Monitoring Transportation System

| station 110 | any station that transports the container, or comes into contact with the masks, such as loadports for lithography tools |
|---|---|
| data 111 | problems encountered with certain loadport |
| data 122 | identification of alternative loadport |
| process 320 | using alternative loadport |

Optionally, some or all of station transmitters 115, 125, 135 (cf. FIG. 3) can be implemented by portable devices with displays. This allows the factory operator to access electronic device 205 at substantially any location.

While the invention has been described in terms of particular structures, steps, devices and materials, those of skill in the art will understand based on the description herein that it is not limited merely to such examples and that the full scope of the invention is properly determined by the claims that follow.

What is claimed is:

1. In an electronic device for a mask container that is adapted to carry a lithography mask between a first station for first processing and a second station for second processing at a later time point, said electronic device comprising:
    a receiver unit to receive first data;
    a memory unit to temporarily store said first data;
    a processor unit to process an instruction that uses said first data and to provide second data, the second data indicating how the second station uses the lithography mask for second processing to determine final quality and quantity of said second processing; and
    a transmitter unit to transmit said second data, a method comprising at least one of:
    using said second data to modify said lithography mask by changing exposure properties of the lithography mask;
    using the second data to perform an action that removes said lithography mask from all further processing; or
    using the second data for testing and measuring properties of said lithography mask.

2. The method of claim 1, further comprising transmitting with said transmitter unit said second data to said second station before said second station uses said lithography mask in said second process.

3. The method of claim 2, further comprising storing said instruction in a memory coupled to said processor unit.

4. The method of claim 3, wherein said instruction is indicative of how said lithography mask is used in said second process by indicating an expected quality and quantity of processing.

5. The method of claim 3, further comprising also receiving said instruction from a host device electrically coupled to the electronic device by a factory bus.

6. The method of claim 5, further comprising receiving said first data at a first time point and receiving said instruction at a second time point that comes later.

7. The method of claim 1, further comprising coupling said receiver unit, said memory unit, said processor unit, and said transmitter unit by a bus.

8. The method of claim 1, further comprising implementing said receiver unit and said transmitter unit as a transceiver unit.

9. The method of claim 8, further comprising implementing said transceiver unit as a wireless transceiver.

10. The method of claim 9, further comprising implementing said wireless transceiver as a radio frequency transceiver.

11. The method of claim 9, further comprising implementing said wireless transceiver as an infra-red transceiver.

12. The method of claim 8, further comprising said transceiver unit communicating with a further electronic device at a further lithography mask container and with further stations.

13. The method of claim 1, further comprising implementing said memory unit as a non-volatile memory.

14. The method of claim 13, further comprising implementing said non-volatile memory as an EEPROM.

15. The method of claim 13, further comprising implementing said non-volatile memory as an SRAM.

16. The method of claim 1 further comprising coupling a power supply to the receiver unit, the memory unit, the processor and the transmitter unit that is implemented by at least a component of the following group: battery, photovoltaic element, thermal converter, and inductive power converter.

17. The method of claim 1 further comprising permanently attaching the electronic device to said mask container by an adhesive.

18. The method of claim 1, further comprising implementing said processor unit and said memory unit on a single monolithic chip.

19. The method of claim 1, wherein for a further lithography mask carried in said mask container, indicating with said second data how a third station uses said further lithography mask for third processing.

20. In an electronic device for a mask container that is adapted to carry a lithography mask between a first station for first processing and a second station for second processing at a later time point, said electronic device comprising:
    a receiver unit to receive first data;
    a memory unit to temporarily store said first data;
    a processor unit to process an instruction that uses said first data and to provide second data, the second data indicating how the second station uses the lithography mask for second processing to determine final quality and quantity of said second processing; and
    a transmitter unit to transmit said second data, a method comprising:
    using said second data to modify said lithography mask by changing exposure properties of the lithography mask at the second station.

* * * * *